(12) United States Patent
Holland et al.

(10) Patent No.: US 7,544,251 B2
(45) Date of Patent: Jun. 9, 2009

(54) METHOD AND APPARATUS FOR CONTROLLING TEMPERATURE OF A SUBSTRATE

(75) Inventors: John Holland, San Jose, CA (US); Theodoros Panagopoulos, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 179 days.

(21) Appl. No.: 10/960,874

(22) Filed: Oct. 7, 2004

(65) Prior Publication Data

US 2006/0076108 A1  Apr. 13, 2006

(51) Int. Cl.
  *H01T 23/00*  (2006.01)
  *H01L 21/00*  (2006.01)
  *C23C 16/00*  (2006.01)
(52) U.S. Cl. .................. 118/724; 156/345.27; 361/234; 279/128
(58) Field of Classification Search ................. 361/234; 279/128; 156/345.27; 118/724, 725
  See application file for complete search history.

(56) References Cited

U.S. PATENT DOCUMENTS

| | | | |
|---|---|---|---|
| 5,838,528 A | 11/1998 | Os et al. | |
| 6,035,101 A | 3/2000 | Sajoto et al. | |
| 6,129,046 A | 10/2000 | Mizuno et al. | |
| 6,256,187 B1 | 7/2001 | Matsunaga et al. | |
| 6,310,755 B1 | 10/2001 | Kholodenko et al. | |
| 6,664,738 B2 | 12/2003 | Arai et al. | |
| 6,793,767 B2 | 9/2004 | Chu et al. | |
| 6,853,533 B2 * | 2/2005 | Parkhe | 361/234 |
| 7,221,553 B2 | 5/2007 | Nguyen | |
| 2002/0021545 A1 | 2/2002 | Tatsumi et al. | |
| 2002/0050248 A1 | 5/2002 | Pratt | |
| 2003/0155079 A1 | 8/2003 | Bailey et al. | |
| 2003/0164226 A1 | 9/2003 | Kanno et al. | |
| 2003/0230551 A1 | 12/2003 | Kagoshima et al. | |
| 2004/0061449 A1 | 4/2004 | Arai et al. | |
| 2004/0185670 A1 | 9/2004 | Hamelin et al. | |
| 2004/0187787 A1 | 9/2004 | Dawson et al. | |
| 2004/0195216 A1 | 10/2004 | Strang | |
| 2004/0261721 A1 | 12/2004 | Steger | |

(Continued)

FOREIGN PATENT DOCUMENTS

CN   2585414 Y   11/2003

(Continued)

OTHER PUBLICATIONS

Raw machine translation of JP 10209257 (10 pages).*

(Continued)

*Primary Examiner*—Sylvia R. MacArthur
(74) *Attorney, Agent, or Firm*—Patterson & Sheridan, LLP

(57) ABSTRACT

A pedestal assembly and method for controlling temperature of a substrate during processing is provided. In one embodiment, the pedestal assembly includes a support member that is coupled to a base by a material layer. The material layer has at least two regions having different coefficients of thermal conductivity. In another embodiment, the support member is an electrostatic chuck. In further embodiments, a pedestal assembly has channels formed between the base and support member for providing cooling gas in proximity to the material layer to further control heat transfer between the support member and the base, thereby controlling the temperature profile of a substrate disposed on the support member.

5 Claims, 5 Drawing Sheets

U.S. PATENT DOCUMENTS

| | | |
|---|---|---|
| 2005/0042881 A1* | 2/2005 | Nishimoto et al. .......... 438/710 |
| 2006/0076108 A1* | 4/2006 | Holland et al. ......... 156/345.27 |
| 2006/0076109 A1* | 4/2006 | Holland et al. ......... 156/345.27 |
| 2006/0158821 A1 | 7/2006 | Miyashita |
| 2007/0102118 A1 | 5/2007 | Holland et al. |
| 2007/0139856 A1 | 6/2007 | Holland et al. |
| 2007/0258186 A1* | 11/2007 | Matyushkin et al. ........ 361/234 |

FOREIGN PATENT DOCUMENTS

| | | | |
|---|---|---|---|
| JP | 0917770 A | * | 1/1997 |
| JP | 10209257 A | * | 8/1998 |

OTHER PUBLICATIONS

Translation of Chinese Office Action for CN Application No. 200510116536.0, consists of 10 unnumbered pages.
Claims co-pending U.S. Appl. No. 11/740,869, filed Apr. 26, 2007.
Claims co-pending U.S. Appl. No. 11/778,019, filed Jul. 14, 2007.
International Search Report, Aug. 3, 2007.
Wail, R.K.. Monitoring residual and process gases in PVD processes: The importance of sensitivity. Micromagazine, Jun. 1997.
Second Office Action for Chinese Application No. 200510116536.0, May 30, 2008, consists of seven pages (1-3 and 1-4) (APPM/9259 CN)—provides a concise explanation of relevance for B1.

* cited by examiner

METHOD AND APPARATUS FOR CONTROLLING TEMPERATURE OF A SUBSTRATE

BACKGROUND OF THE INVENTION

1. Field of the Invention

Embodiments of the present invention generally relate to semiconductor substrate processing systems. More specifically, the invention relates to a method and apparatus for controlling temperature of a substrate in a semiconductor substrate processing system.

2. Description of the Related Art

In manufacture of integrated circuits, precise control of various process parameters is required for achieving consistent results within a substrate, as well as the results that are reproducible from substrate to substrate. During processing, changes in the temperature and temperature gradients across the substrate may be detrimental to material deposition, etch rate, step coverage, feature taper angles, and other parameters of semiconductor devices. As such, generation of the predetermined pattern of temperature distribution across the substrate is one of critical requirements for achieving high yield.

In some processing applications, a substrate is retained to a substrate pedestal by an electrostatic chuck during processing. The electrostatic chuck is coupled to a base of the pedestal by clamps, adhesive or fasteners. The chuck may be provided with an embedded electric heater, as well as be fluidly coupled to a source of backside heat transfer gas for controlling substrate temperature during processing. However, conventional substrate pedestals have insufficient means for controlling substrate temperature distribution across the diameter of the substrate. The inability to control substrate temperature uniformity has an adverse effect on process uniformity both within a single substrate and between substrates, device yield and overall quality of processed substrates.

Therefore, there is a need in the art for an improved method and apparatus for controlling temperature of a substrate during processing the substrate in a semiconductor substrate processing apparatus.

SUMMARY OF THE INVENTION

The present invention generally is a method and apparatus for controlling temperature of a substrate during processing the substrate in a semiconductor substrate processing apparatus. The method and apparatus enhances temperature control across the diameter of a substrate, and may be utilized in etch, deposition, implant, and thermal processing systems, among other applications where the control of the temperature profile of a workpiece is desirable.

In one embodiment of the invention, a substrate pedestal assembly is provided. The pedestal assembly includes a support member that is coupled to a base using a material layer. The material layer has at least two regions having different coefficients of thermal conductivity. In another embodiment, the support member is an electrostatic chuck. In further embodiments, a pedestal assembly has channels formed between the base and support member for providing cooling gas in proximity to the material layer to further control heat transfer between the support member and the base, thereby facilitating control of the temperature profile of a substrate disposed on the support member.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures.

DETAILED DESCRIPTION

The present invention generally is a method and apparatus for controlling temperature of a substrate during processing. Although invention is illustratively described in a semiconductor substrate processing apparatus, such as, e.g., a processing reactor (or module) of a CENTURA® integrated semiconductor wafer processing system, available from Applied Materials, Inc. of Santa Clara, Calif., the invention may be utilized in other processing systems, including etch, deposition, implant and thermal processing, or in other application where control of the temperature profile of a substrate or other workpiece is desirable.

Figure 1A:
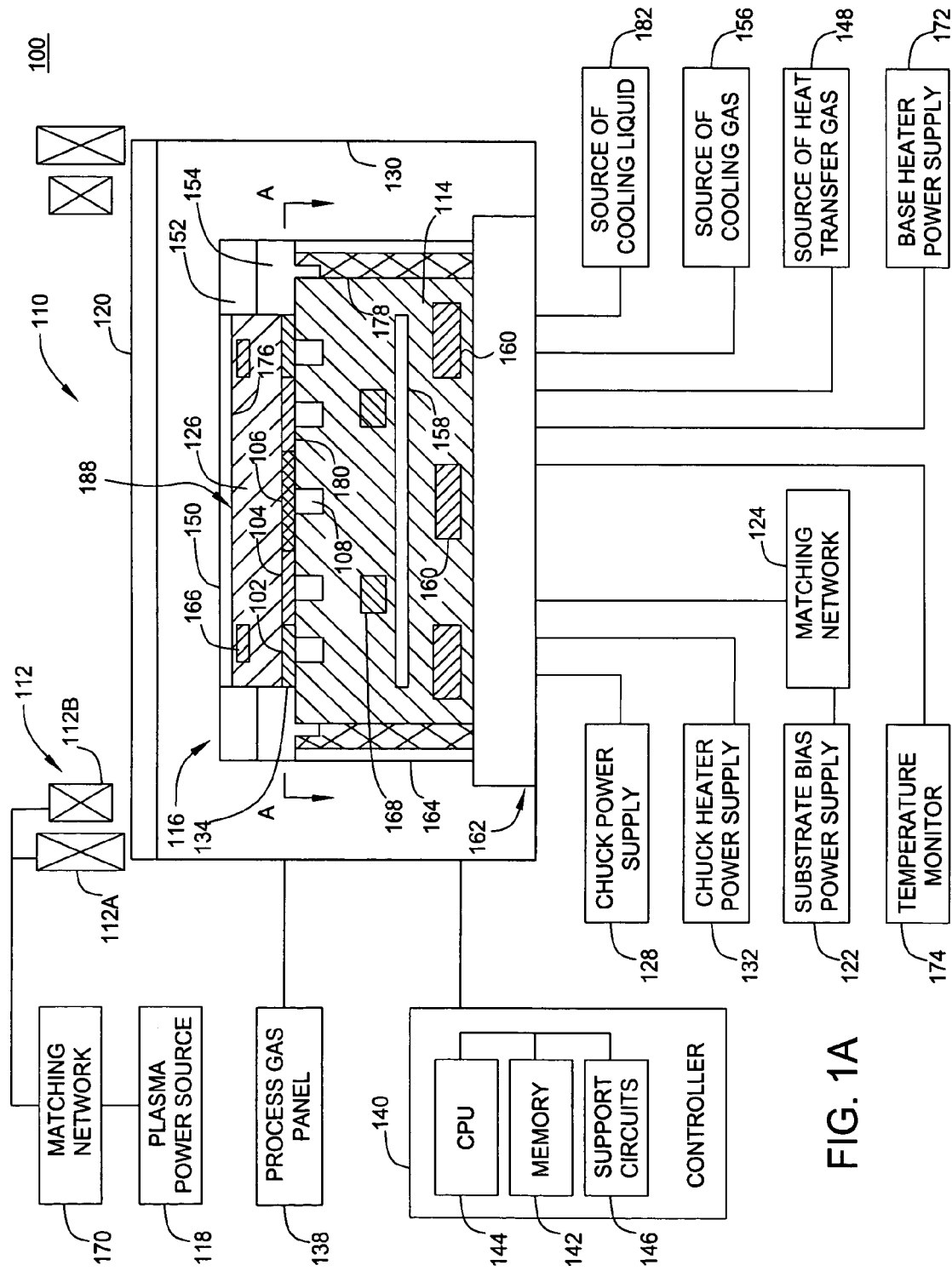
FIG. 1A is a schematic diagram of an exemplary semiconductor substrate processing apparatus comprising a substrate pedestal in accordance with one embodiment of the invention.
Figure 1B:
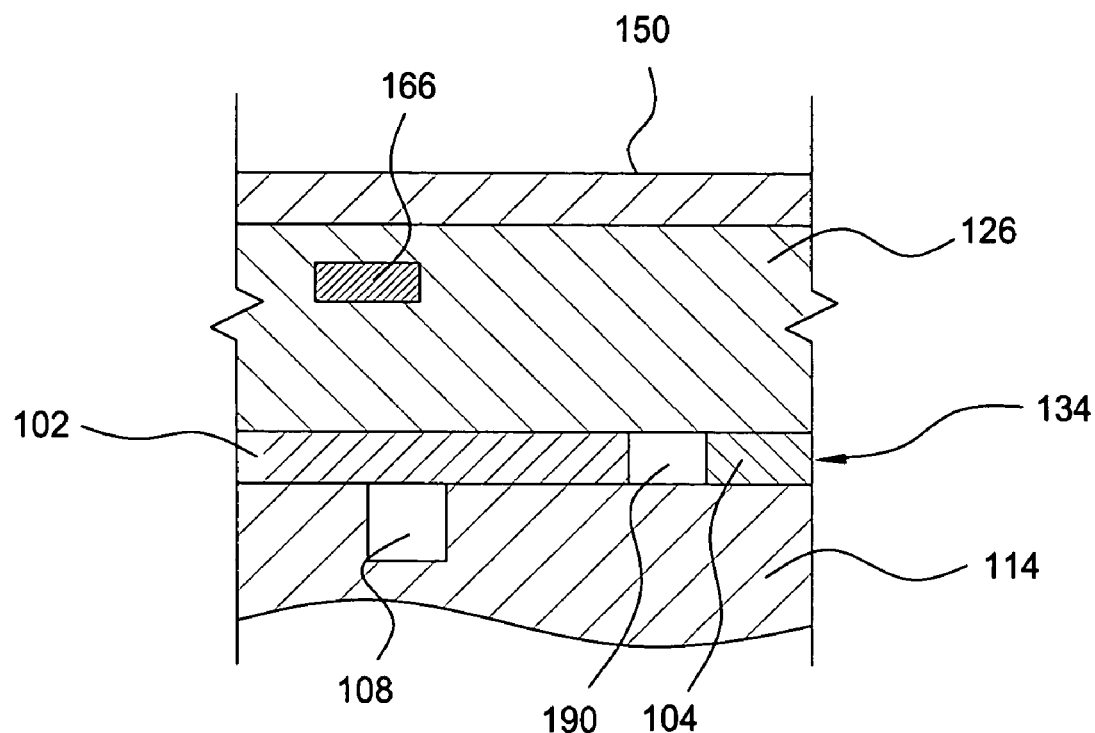
FIGS. 1B-1C are partial cross-sectional views of embodiments of a substrate pedestal having gaps formed in different locations in a material layer of the substrate pedestal.

FIG. 1 depicts a schematic diagram of an exemplary etch reactor 100 having one embodiment of a substrate pedestal assembly 116 that may illustratively be used to practice the invention. The particular embodiment of the etch reactor 100 shown herein is provided for illustrative purposes and should not be used to limit the scope of the invention.

Etch reactor 100 generally includes a process chamber 110, a gas panel 138 and a controller 140. The process chamber 110 includes a conductive body (wall) 130 and a ceiling 120 that enclose a process volume. Process gasses are provided to the process volume of the chamber 110 from the gas panel 138.

The controller 140 includes a central processing unit (CPU) 144, a memory 142, and support circuits 146. The controller 140 is coupled to and controls components of the etch reactor 100, processes performed in the chamber 110, as well as may facilitate an optional data exchange with databases of an integrated circuit fab.

In the depicted embodiment, the ceiling 120 is a substantially flat dielectric member. Other embodiments of the process chamber 110 may have other types of ceilings, e.g., a dome-shaped ceiling. Above the ceiling 120 is disposed an antenna 112 comprising one or more inductive coil elements (two co-axial coil elements 112A and 112B are illustratively shown). The antenna 112 is coupled, through a first matching network 170, to a radio-frequency (RF) plasma power source 118.

In one embodiment, the substrate pedestal assembly 116 includes a support member 126, a thermoconductive layer 134, a base 114, a collar ring 152, a joint ring 154, a spacer 178, a ground sleeve 164 and a mount assembly 162. The mounting assembly 162 couples the base 114 to the process chamber 110. The base 114 is generally formed from ceramic or similar dielectric material. In the depicted embodiment, the base 114 further comprises at least one optional embedded heater 158 (one heater 158 is illustratively shown), at least one optional embedded insert 168 (one annular insert 168 is illustratively shown), and a plurality of optional conduits 160 fluidly coupled to a source 182 of a heating or cooling liquid. In this embodiment, the base 114 is further thermally separated from the ground sleeve 164 using an optional spacer 178.

The conduits 160 and heater 158 may be utilized to control the temperature of the base 114, thereby heating or cooling the support member 126, thereby controlling, in part, the temperature of a substrate 150 disposed on the support member 126 during processing.

The insert 168 is formed from a material having a different coefficient of thermal conductivity than the material of the adjacent regions of the base 114. Typically, the inserts 168 has a smaller coefficient of thermal conductivity than the base 114. In a further embodiment, the inserts 168 may be formed from a material having an anisotropic (i.e. direction-dependent coefficient of thermal conductivity). The insert 168 functions to locally change the rate of heat transfer between the support member 126 through the base 114 to the conduits 160 relative to the rate of heat transfer though neighboring portions of the base 114 not having an insert 168 in the heat transfer path. Thus, by controlling the number, shape, size, position and coefficient of heat transfer of the inserts, the temperature profile of the support member 126, and the substrate 150 seated thereon, may be controlled. Although the insert 168 is depicted in FIG. 1 shaped as an annular ring, the shape of the insert 168 may take any number of forms.

The thermoconductive layer 134 is disposed on a chuck supporting surface 180 of the base 114 and facilitates thermal coupling (i.e., heat exchange) between the support member 126 and the base 114. In one exemplary embodiment, the thermoconductive layer 134 is an adhesive layer that mechanically bonds the support member 126 to member supporting surface 180. Alternatively (not shown), the substrate pedestal assembly 116 may include a hardware (e.g., clamps, screws, and the like) adapted for fastening the support member 126 to the base 114. Temperature of the support member 126 and the base 114 is monitored using a plurality of sensors (not shown), such as, thermocouples and the like, that are coupled to a temperature monitor 174.

The support member 126 is disposed on the base 114 and is circumscribed by the rings 152, 154. The support member 126 may be fabricated from aluminum, ceramic or other materials suitable for supporting the substrate 150 during processing. The substrate 150 may rest upon the support member 126 by gravity, or alternatively be secured thereto by vacuum, electrostatic force, mechanical clamps and the like. The embodiment depicted in FIG. 1, the support member 126 is an electrostatic chuck 188.

The electrostatic chuck 188 is generally formed from ceramic or similar dielectric material and comprises at least one clamping electrode (not shown) controlled using a power supply 128. In a further embodiment, the electrostatic chuck 188 may comprise at least one RF electrode (not shown) coupled, through a second matching network 124, to a power source 122 of substrate bias, and may also include at least one embedded heater (not shown) controlled using a power supply 132.

The electrostatic chuck 188 may further comprise a plurality of gas passages (not shown), such as grooves, that are formed in a substrate supporting surface 176 of the chuck and fluidly coupled to a source 148 of a heat transfer (or backside) gas. In operation, the backside gas (e.g., helium (He)) is provided at controlled pressure into the gas passages to enhance the heat transfer between the electrostatic chuck 188 and the substrate 150. Conventionally, at least the substrate supporting surface 176 of the electrostatic chuck is provided with a coating resistant to the chemistries and temperatures used during processing the substrates.

In one embodiment, the support member 126 comprises at least one embedded insert 166 (one annular insert 166 is illustratively shown) formed from at least one material having a different coefficient of thermal conductivity than the material(s) of adjacent regions of the support member 126. Typically, the inserts 166 are formed from materials having a smaller coefficient of thermal conductivity than the material(s) of the adjacent regions. In a further embodiment, the inserts 166 may be formed from materials having an anisotropic coefficient of thermal conductivity. In an alternate embodiment (not shown), at least one insert 166 may be disposed coplanar with the substrate supporting surface 176.

As with the inserts 168 of the base 114, the thermal conductivity, as well as the shape, dimensions, location, and number of inserts 166 in the support member 126 may be selectively chosen to control the heat transfer through the pedestal assembly 116 to achieve, in operation, a pre-determined pattern of the temperature distribution on the substrate supporting surface 176 of the support member 126 and, as such, across the diameter of the substrate 150.

The thermoconductive layer 134 comprises a plurality of material regions (two annular regions 102, 104 and circular region 106 are illustratively shown), at least two of which having different coefficients of thermal conductivity. Each region 102, 104, 108 may be formed from at least one material having a different coefficient of thermal conductivity than the material(s) of adjacent regions of the thermoconductive layer 134. In a further embodiment, one or more of the materials comprising the regions 102, 104, 106 may have an anisotropic coefficient of thermal conductivity. For example, coefficients of thermal conductivity of materials in the layer 134 in the directions orthogonal or parallel to the member supporting surface 180 may differ from the coefficients in at least one other direction. The coefficient of thermal conductivity between the regions 102, 104, 106 of the layer 134 may be selected to promote laterally different rates of heat transfer between the chuck 126 and base 114, thereby controlling the temperature distribution across the diameter of the substrate 150.

Figure 1C:
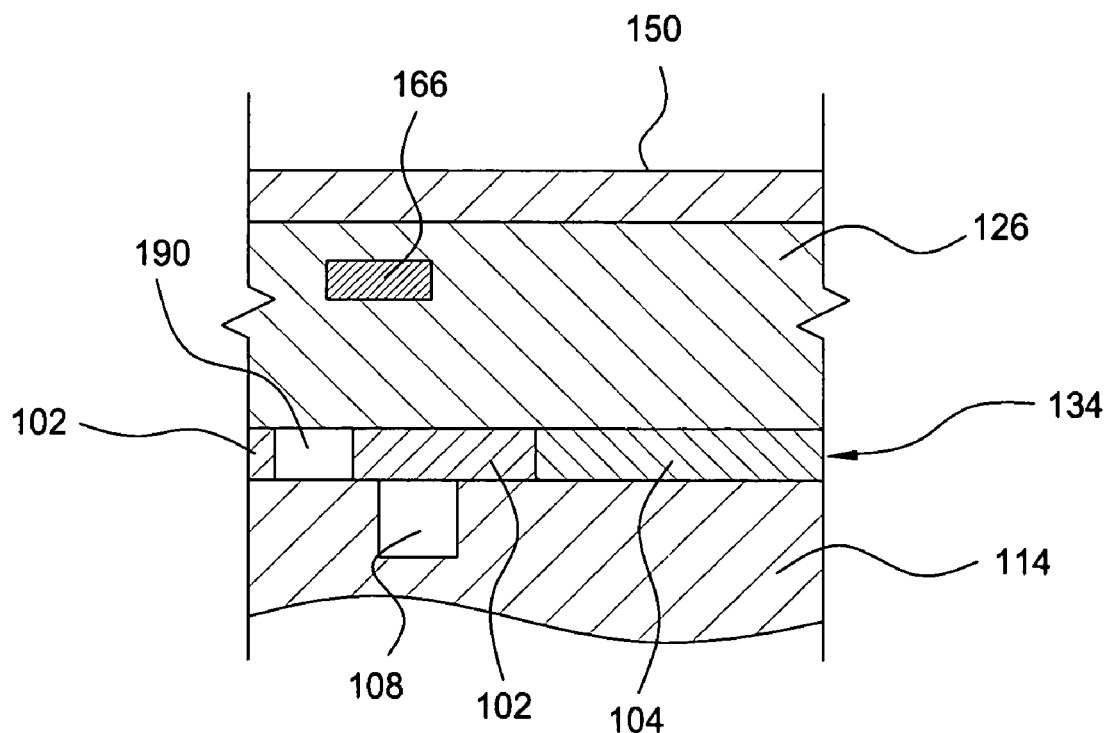

In yet further embodiment, gaps 190 (as shown in FIG. 2A) maybe provided between at least two adjacent regions of the thermoconductive layer 134. In the layer 134, such gaps 190 may form either gas-filled or vacuumed volumes having predetermined form factors. A gap 190 may alternatively be formed within a region of the layer 134 (as shown in FIG. 1C).

Figure 2:
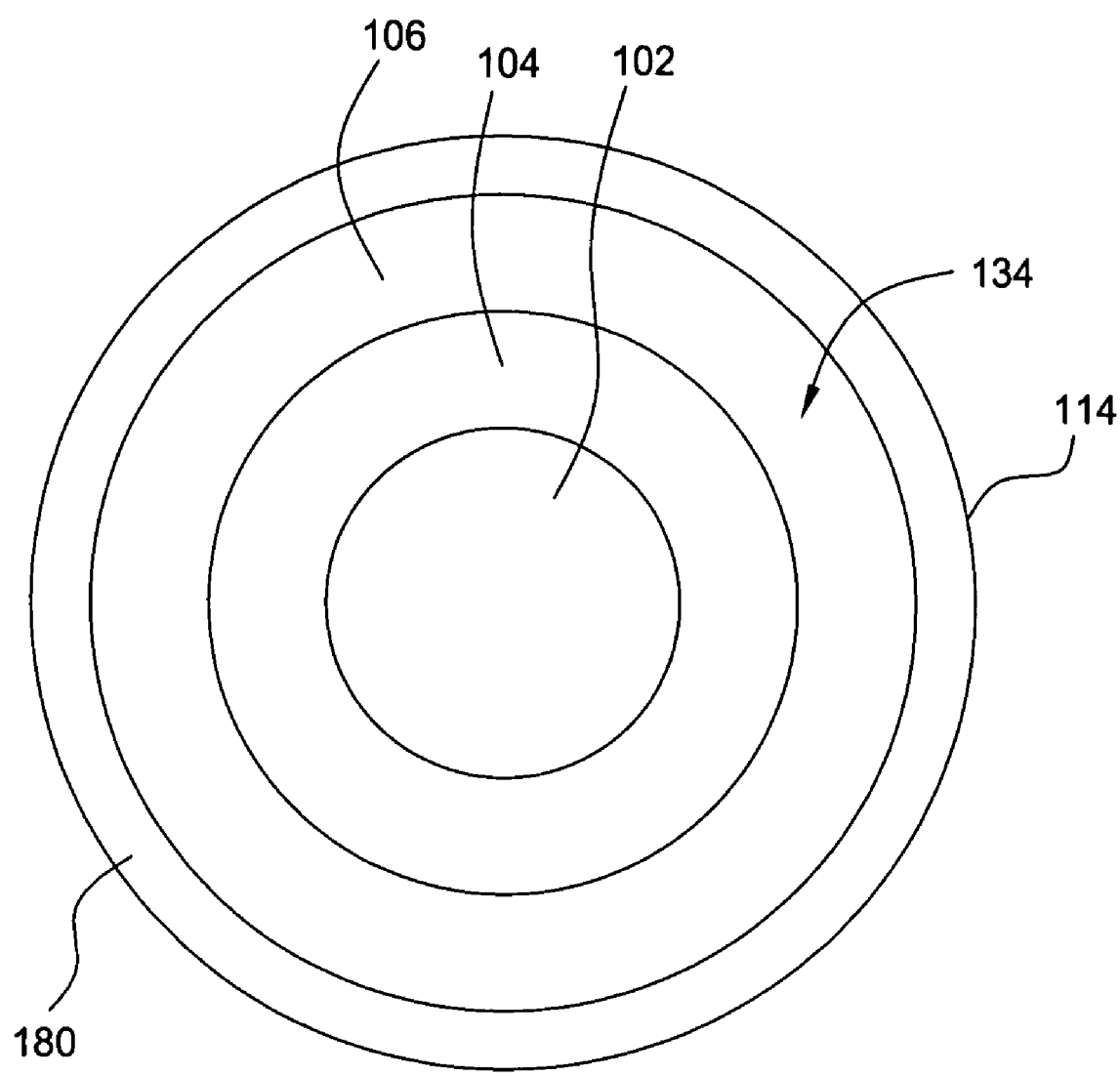
FIG. 2 is a schematic cross-sectional view of the substrate pedestal taken along a line 2-2 of FIG. 1A.

FIG. 2 depicts a schematic cross-sectional view of the substrate pedestal taken along a line 2-2 in FIG. 1A. In the depicted embodiment, the thermoconductive layer 134 illustratively comprises the annular regions 102, 104 and the circular region 106. In alternate embodiments, the layer 134 may comprise either more or less than three regions, as well as regions having different form factors, for example, the regions may be arranged as grids, radially oriented shapes, and polar arrays among others. The regions of the thermoconductive layer 134 may be composed from materials (e.g., adhesive materials) applied in a form of a paste that is further developed into a hard adhesive compound, as well as in a form of an adhesive tape or an adhesive foil. Thermal conductivity of the materials in the thermoconductive layer 134 may be selected in a range from 0.01 to 200 W/mK and, in one exemplary embodiment, in a range from 0.1 to 10 W/mK. In yet another embodiment, the adjacent regions have a difference in thermal conductivities in the range of about 0.1 to 10 W/mK, and may have a difference in conductivity between an inner most and out most regions of the layer 134 of about 0.1 to about 10 W/mK. Examples of suitable adhesive materials include, but not limited to, pastes and tapes comprising acrylic and silicon based compounds. The adhesive materials may additionally include at least one thermally conductive ceramic filler, e.g., aluminum oxide ($Al_2O_3$), aluminum nitride (AlN), and titanium diboride ($TiB_2$), and the like. One example of an adhesive tape suitable for the conductive layer 134 is sold under the tradename THERMATTACH®, available from Chomerics, a division of Parker Hannifin Corporation, located in Wolburn, Mass.

In the thermoconductive layer 134, the thermal conductivity, as well as the form factor, dimensions, and a number of regions having the pre-determined coefficients of thermal conductivity may be selectively chosen to control the heat transfer between the electrostatic chuck 126 and the base 114 to achieve, in operation, a pre-determined pattern of the temperature distribution on the substrate supporting surface 176 of the chuck and, as such, in the substrate 150. To further control the heat transfer through the conductive layer 134 between the base 114 and support member 126, one or more channels 108 are provided to flow a heat transfer medium therethrough. The channels 108 are coupled through the base 114 to a source 150 of heat transfer medium, such as a cooling gas. Some examples of suitable cooling gases include helium and nitrogen, among others. As the cooling gas disposed in the channels 108 is part of the heat transfer path between the chuck 126 and base 114, the position of the channels 108, and the pressure, flow rate, temperature, density and composition of the heat transfer medium of cooling gas provided, provides enhanced control of the heat transfer profile through the pedestal assembly 116. Moreover, as the density and flow rate of gas in the channel 108 may be controlled in-situ during processing of substrate 150, the temperature control of the substrate 150 may be changed during processing to further enhance processing performance. Although a single source 156 of cooling gas is shown, it is contemplated that one or more sources of cooling gas may be coupled to the channels 108 in a manner such that the types, pressures and/or flow rate of cooling gases within individual channels 108 may be independently controller, thereby facilitating an even greater level of temperature control.

Figure 3:
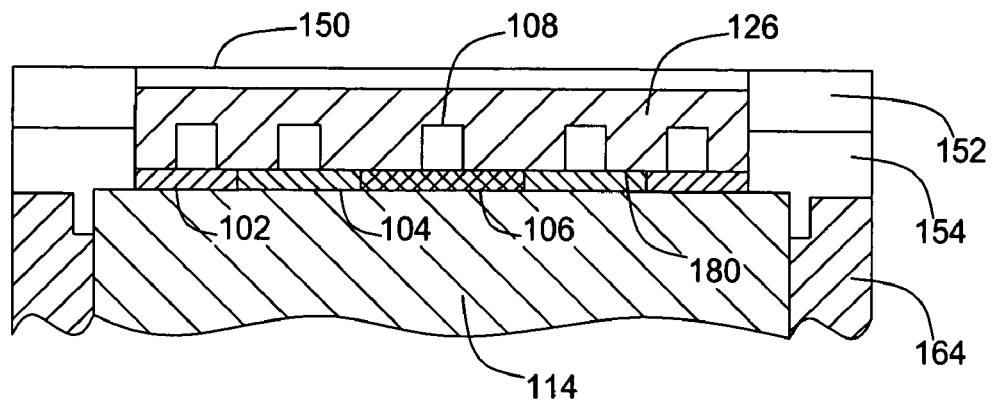
FIG. 3 is a schematic partial cross-sectional view of another embodiment of the invention.
Figure 4:
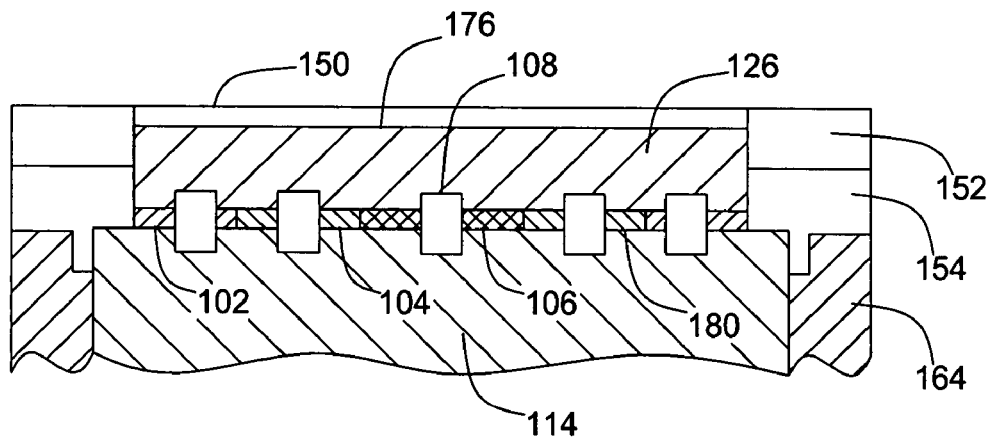
FIG. 4 is a schematic partial cross-sectional view of another embodiment of the invention.
Figure 5:
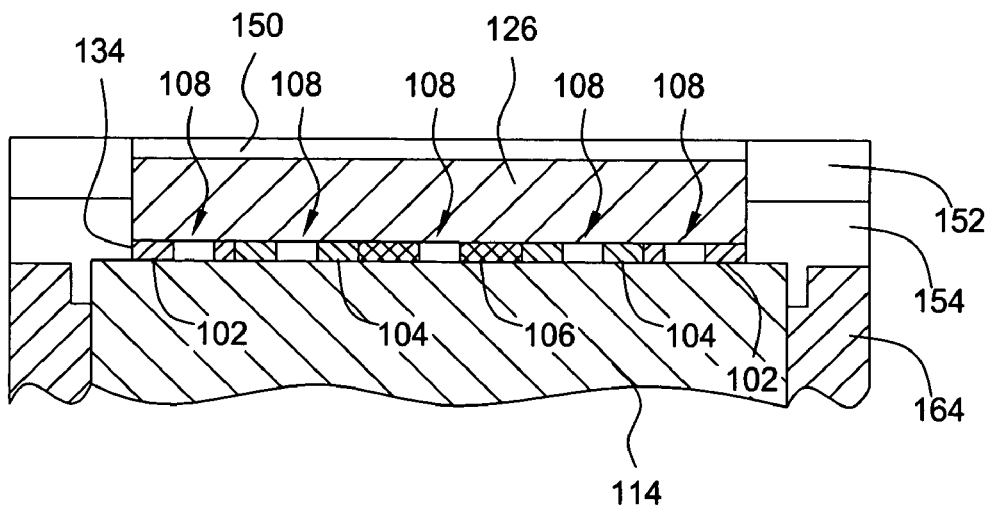
FIG. 5 is a schematic partial cross-sectional view of yet another embodiment of the invention.

In the embodiment depicted in FIG. 1A, the channels 108 are depicted as formed in the member supporting surface 180. However, it is contemplated that the channels 108 may be formed at least partially in the member supporting surface 180, at least partially in the bottom surface of the support member 126, or at least partially in the thermally conductive layer 134, along with combinations thereof. In one embodiment, between about 2 to 10 channels 108 are disposed in the pedestal assembly 116 and provide with the selectivity maintained at a pressure between about 760 Torr (atmospheric pressure) to about 10 Torr. For example, at least one of the channels 108 may be partially or entirely formed in the electrostatic chuck 126, as illustrated in FIGS. 3-4. More specifically, FIG. 3 depicts a schematic diagram of a portion of the substrate pedestal assembly 116 where the channels 108 are formed entirely in the electrostatic chuck 126. FIG. 4 depicts a schematic diagram of a portion of the substrate pedestal assembly 116 where the channels 108 are partially formed in the base 114 and, partially, in the electrostatic chuck 126. FIG. 5 depicts a schematic diagram of a portion of the substrate pedestal assembly 116 where the channels 108 are formed in the thermoconductive layer 134. Although in FIG. 5 the channels are shown disposed between different regions 102, 104, 106 of the thermoconductive layer 134, the one or more of the channels may be formed through one or more of the regions 102, 104,106.

Returning to FIG. 1A, at least one of the location, shape, dimensions, and number of the channels 108 and inserts 166, 168 as well as the thermal conductivity of the inserts 166, 168 and gas disposed in the channels 108, may be selectively chosen to control the heat transfer between the support member 126 to the base 114 to achieve, in operation, a pre-determined pattern of the temperature distribution on the substrate supporting surface 176 of the chuck 126 and, as such, control the temperature profile of the substrate 150. In further embodiments, the pressure of the cooling gas in at least one channel 108, as well as the flow of the cooling liquid in at least one conduit 156 may also be selectively controlled to achieve and/or enhance temperature control of the substrate. The heat transfer rate may also be controlled by individually controlling the type of gas, pressure and/or flow rate between respective channels 108.

In yet further embodiments, the pre-determined pattern of the temperature distribution in the substrate 150 may be achieved using individual or combinations of the described control means, e.g., the thermoconductive layer 134, the inserts 166, 168, channels 108, conduits 160, the pressure of cooling gas in the channels 108, and the flow of the cooling liquid in the conduits 160. Furthermore, in the discussed above embodiments, pre-determined patterns of the temperature distribution on the substrate supporting surface 176 and in the substrate 150 may additionally be selectively controlled to compensate for non-uniformity of the heat fluxes originated, during processing the substrate 150, by a plasma of the process gas and/or substrate bias.

Figure 6:
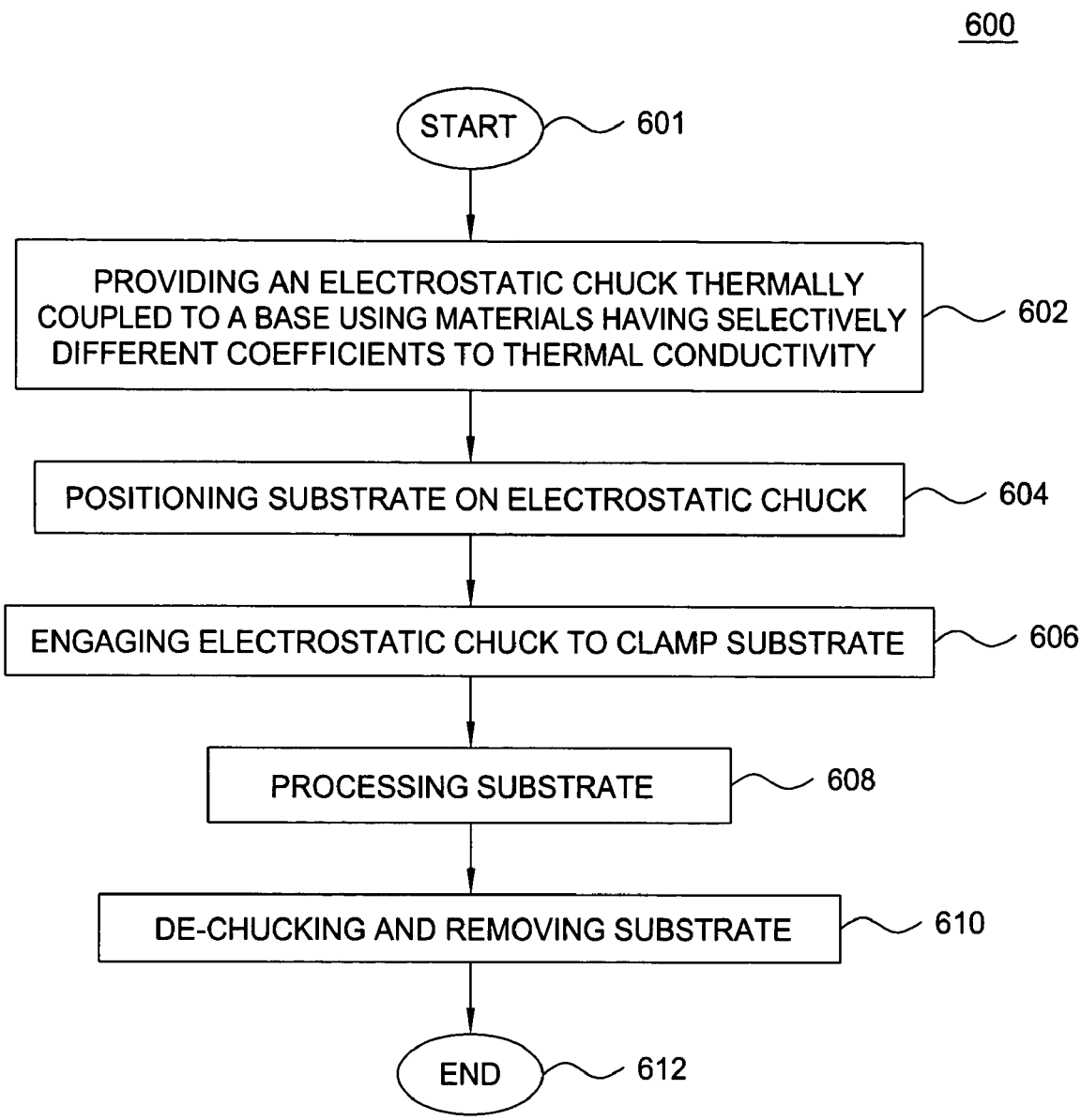
FIG. 6 is a flow diagram of one embodiment of a method for controlling temperature of a substrate disposed on a substrate pedestal.

FIG. 6 depicts a flow diagram of one embodiment of an inventive method for controlling temperature of a substrate processed in a semiconductor substrate processing apparatus as a process 600. The process 600 illustratively includes the processing steps performed upon the substrate 150 during processing in the reactor 100 described in the embodiments above. It is contemplated that the process 600 may be performed in other processing systems.

The process 600 starts at step 601 and proceeds to step 602. At step 602, the substrate 150 is transferred to the pedestal assembly 116 disposed in the process chamber 110. At step 604, the substrate 150 is positioned (e.g., using a substrate robot, not shown) on the substrate supporting surface 176 of the electrostatic chuck 188. At step 606, the power supply 132 engages the electrostatic chuck 188 to clamp the substrate 150 to the supporting surface 176 of the chuck 188. At step 608, the substrate 150 is processed (e.g., etched) in the process chamber 110 in accordance with a process recipe executed as directed by the controller 140. During step 608, the substrate pedestal assembly 116 facilitates a pre-determined pattern of temperature distribution in the substrate 150, utilizing one or more of the temperature control attributes of the pedestal assembly 116 discussed in reference to FIGS. 1-5 above. Optionally, the rate and/or profile of heat transferred through the chuck 114 during step 608 may be adjusted in-situ by changing one or more of the characteristics of the gas present in one or more of the channels 108. Upon completion of processing, at step 610, the power supply 132 disengages the electrostatic chuck 188 and, as such, de-chucks the substrate 150 that is further removed from the process chamber 110. At step 612, the process 600 ends.

While the foregoing is directed to embodiments of the present invention, other and further embodiments of the invention may be devised without departing from the basic scope thereof, and the scope thereof is determined by the claims that follow.

What is claimed is:

1. An apparatus for processing a substrate, comprising:
a process chamber;
a substrate pedestal assembly disposed in the chamber and comprising a base coupled to an electrostatic chuck by a material layer, wherein the material layer is an adhesive comprising at least two different adhesive material regions formed in a planar surface having different coefficients of thermal conductivity, the regions arranged to define laterally separated heat transfer rate zones between the base and chuck, wherein the regions are laterally separated in a direction parallel to an upper surface of the substrate pedestal assembly;
a first channel formed between the chuck and base;
a source of at least one process gas coupled to the chamber; and
a source of heat transfer medium fluidly coupled to the first channel.

2. The apparatus of claim 1 further comprising a second channel disposed between the base and electrostatic chuck, wherein at least one attribute of cooling gas provided to the first channel is independently controllable relative to an attribute of cooling gas provided to the second channel.

3. An apparatus for processing a substrate, comprising:
a process chamber;
a substrate pedestal assembly disposed in the process chamber, the substrate pedestal assembly comprising a base and an electrostatic chuck;
an adhesive material layer securing the base to the electrostatic chuck, wherein the material layer is a silicon-based adhesive having laterally separated regions of different coefficients of thermal conductivity arranged to define different heat transfer rate zones between the base and chuck, wherein the regions are laterally separated in a direction parallel to an upper surface of the substrate pedestal assembly, wherein each of said regions are made of different adhesive material and
a source of at least one process gas coupled to the chamber.

4. The apparatus of claim 3, wherein the regions are concentric.

5. An apparatus for processing a substrate, comprising:
a process chamber;
a substrate pedestal assembly disposed in the process chamber, the substrate pedestal assembly comprising a base and an electrostatic chuck;
an adhesive material layer securing the base to the electrostatic chuck, wherein the material layer is an acrylic-based adhesive having laterally separated regions of different coefficients of thermal conductivity arranged to define different heat transfer rate zones between the base and chuck, wherein the regions are laterally separated in a direction parallel to an upper surface of the substrate pedestal assembly, wherein each of said regions are made of different adhesive material; and
a source of at least one process gas coupled to the chamber.

* * * * *

UNITED STATES PATENT AND TRADEMARK OFFICE
CERTIFICATE OF CORRECTION

PATENT NO. : 7,544,251 B2  Page 1 of 1
APPLICATION NO. : 10/960874
DATED : June 9, 2009
INVENTOR(S) : Holland et al.

It is certified that error appears in the above-identified patent and that said Letters Patent is hereby corrected as shown below:

On the Title Pg, Item -56-; (U.S. Patent Documents), line 4, delete "2002/0050248 A1 5/2002 Pratt" and insert -- 2002/0050246 A1 5/2002 Parkhe --, therefor.

On the Title Pg, Pg 2, Item -56-; (Other Publications), line 6, delete "Wail" and insert -- Wait --, therefor.

Signed and Sealed this

Fifteenth Day of September, 2009

David J. Kappos
*Director of the United States Patent and Trademark Office*